United States Patent
Kibune

(10) Patent No.: US 8,797,076 B2
(45) Date of Patent: Aug. 5, 2014

(54) DUTY RATIO CORRECTION CIRCUIT, DOUBLE-EDGED DEVICE, AND METHOD OF CORRECTING DUTY RATIO

(71) Applicant: Fujitsu Limited, Kawasaki (JP)

(72) Inventor: Masaya Kibune, Machida (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 13/907,388

(22) Filed: May 31, 2013

(65) Prior Publication Data

US 2013/0328602 A1    Dec. 12, 2013

(30) Foreign Application Priority Data

Jun. 7, 2012 (JP) ................. 2012-130254

(51) Int. Cl.
  *H03K 3/017*    (2006.01)
(52) U.S. Cl.
  USPC .......................... 327/175; 327/171
(58) Field of Classification Search
  USPC ..................... 327/170–175, 31, 33
  See application file for complete search history.

(56) References Cited

U.S. PATENT DOCUMENTS

| 5,614,855 A * | 3/1997 | Lee et al. ............. 327/158 |
| 6,888,387 B2 * | 5/2005 | Saeki .................... 327/163 |

FOREIGN PATENT DOCUMENTS

| JP | 06-97789 A | 4/1994 |
| JP | 2001-217694 A | 8/2001 |

* cited by examiner

*Primary Examiner* — An Luu
(74) *Attorney, Agent, or Firm* — Arent Fox LLP

(57) ABSTRACT

A duty ratio correction circuit, includes: a frequency divider configured to output a second clock signal having a first level that is inverted at a timing of a first edge of a first clock signal and a third clock signal having a second level that is inverted at a timing of a second edge of the first clock signal; phase interpolator configured to generate a fourth clock signal and a fifth clock signal based on phase interpolation of any two of the second clock signal, the third clock signal, a first inverted signal that is obtained by inverting the second clock signal, or a second inverted signal that is obtained by inverting the third clock signal; and a multiplier configured to output an exclusive OR signal of the fourth clock signal and the fifth clock signal as a sixth clock signal.

10 Claims, 20 Drawing Sheets

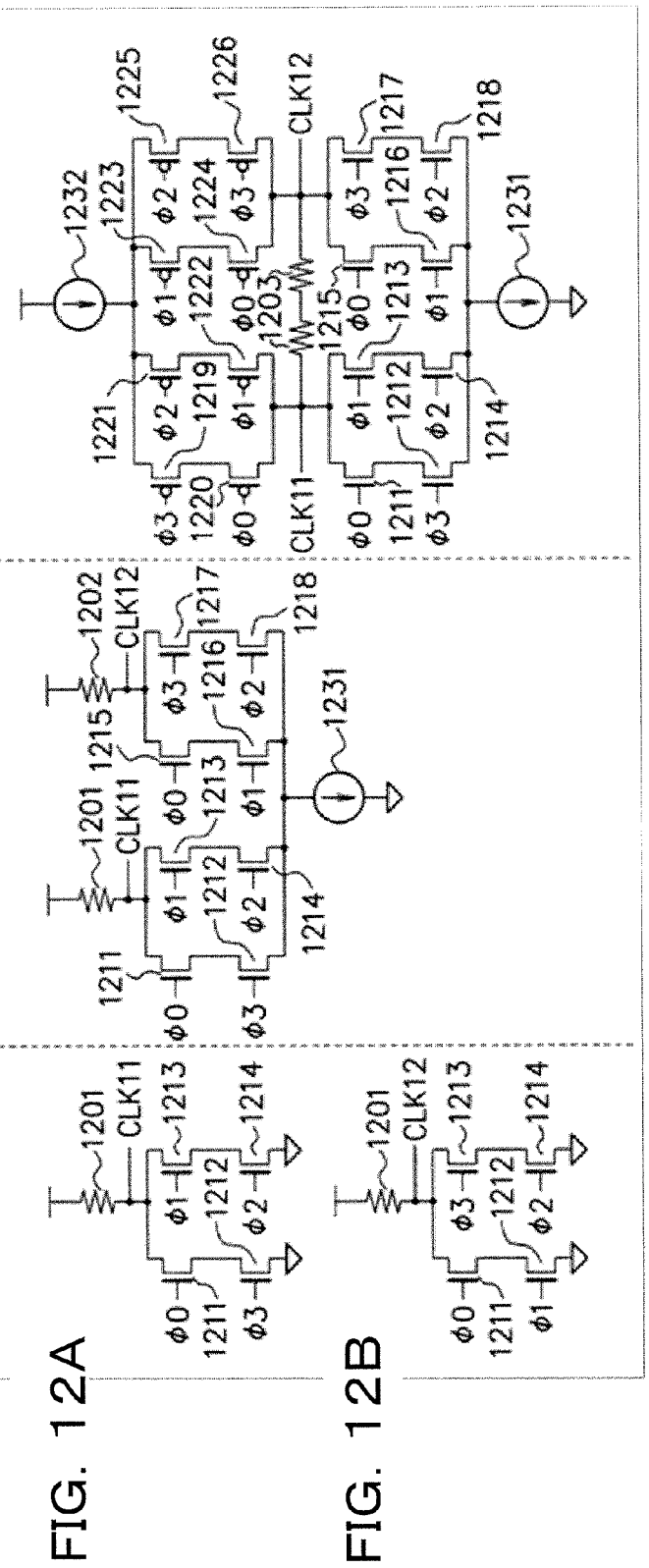

FIG. 19

| PH | PHASE (DEGREE) | DELAY TIME (ps) |
|---|---|---|
| 0 | 270 | 120 |
| ⋮ | ⋮ | ⋮ |
| 16 | 225 | 100 |
| ⋮ | ⋮ | ⋮ |
| 32 | 180 | 80 |
| ⋮ | ⋮ | ⋮ |
| 48 | 135 | 60 |
| ⋮ | ⋮ | ⋮ |
| 64 | 90 | 40 |
| ⋮ | ⋮ | ⋮ |
| 80 | 45 | 20 |
| ⋮ | ⋮ | ⋮ |
| 96 | 0 | 0 |
| ⋮ | ⋮ | ⋮ |
| 112 | 315 | 140 |
| ⋮ | ⋮ | ⋮ |

DUTY RATIO CORRECTION CIRCUIT, DOUBLE-EDGED DEVICE, AND METHOD OF CORRECTING DUTY RATIO

CROSS-REFERENCE TO RELATED APPLICATION

This application is based upon and claims the benefit of priority of the prior Japanese Patent Application No. 2012-130254, filed on Jun. 7, 2012, the entire contents of which are incorporated herein by reference.

FIELD

The embodiments discussed herein are related to a duty ratio correction circuit, a double-edged device, and a method of correcting a duty ratio.

BACKGROUND

A delay adjustment circuit includes a first gate group in which each gate is coupled in series to carry out fine adjustment of a delay time of an input signal, a load capacity that is coupled to an output side of a particular gate out of the first gate group via a first switch mechanism, and a second gate group that is coupled to an output side of the first gate group via a second switch mechanism to carry out coarse adjustment of a delay time of an input signal. The first and second switch mechanisms are controlled, by adjusting the load capacity that is coupled to the output side of the particular gate out of the first gate group and a number of gate stages of the second gate group, so as to adjust the delay time of the input signal.

One of such related techniques is disclosed in Japanese Laid-open Patent Publication No. 2001-217694.

SUMMARY

According to one aspect of the embodiments, a duty ratio correction circuit, includes: a frequency divider configured to output a second clock signal having a first level that is inverted at a timing of a first edge of a first clock signal and a third clock signal having a second level that is inverted at a timing of a second edge of the first clock signal; phase interpolator configured to generate a fourth clock signal and a fifth clock signal based on phase interpolation of any two of the second clock signal, the third clock signal, a first inverted signal that is obtained by inverting the second clock signal, or a second inverted signal that is obtained by inverting the third clock signal; and a multiplier configured to output an exclusive OR signal of the fourth clock signal and the fifth clock signal as a sixth clock signal.

The object and advantages of the invention will be realized and attained by means of the elements and combinations particularly pointed out in the claims.

It is to be understood that both the foregoing general description and the following detailed description are examples and are explanatory in nature and are not restrictive of the invention, as claimed.

BRIEF DESCRIPTION OF DRAWINGS

FIGS. 12A through 12D illustrate an example multiplier;
FIG. 19 illustrates an example phase code table.

DESCRIPTION OF EMBODIMENTS

Figure 1A:
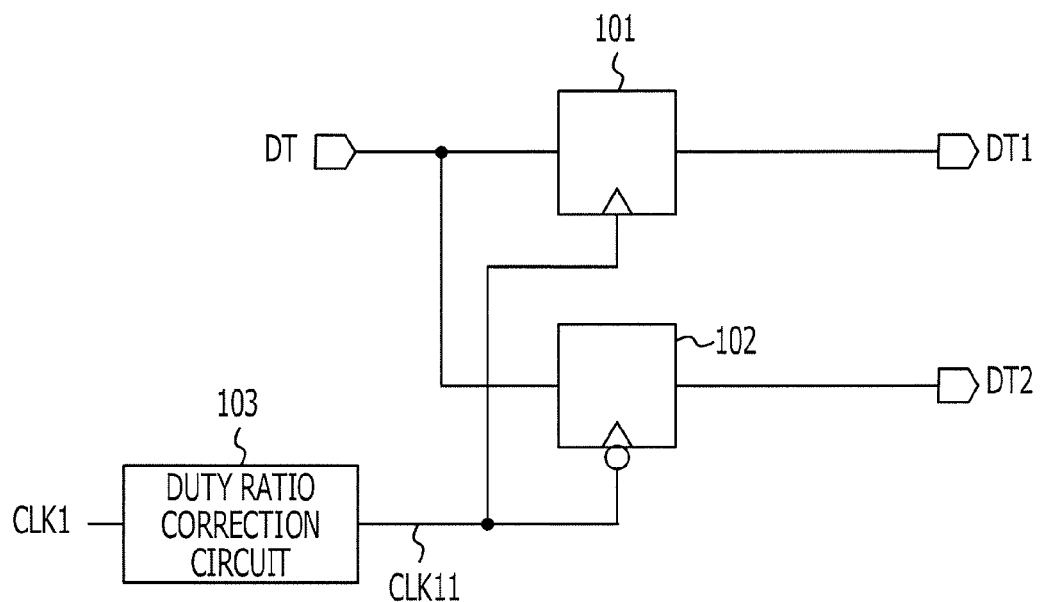
FIG. 1A illustrates an example double-edged device.
Figure 1B:
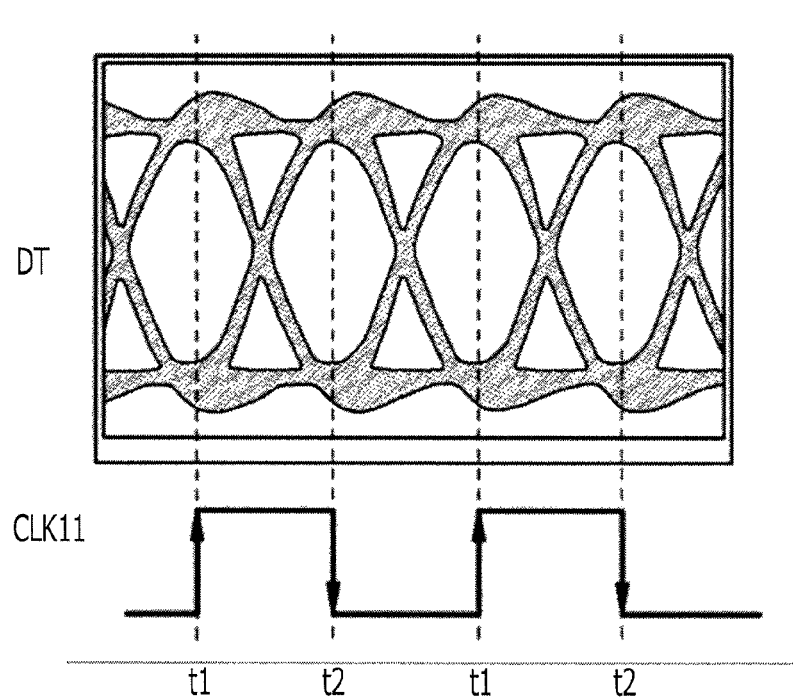
FIG. 1B illustrates an example operation of a double-edged device.

FIG. 1A illustrates an example double-edged device. FIG. 1B illustrates an example operation of a double-edged device. FIG. 1B is a timing diagram of the double-edged device illustrated in FIG. 1A. The double-edged device has a duty ratio correction circuit 103 and comparators 101, 102. The duty ratio correction circuit 103 corrects a duty ratio of a clock signal CLK1 that is input thereto and outputs a clock signal CLK11. The duty ratio may be a value obtained by dividing a high level period of a clock signal by a cycle of the clock signal.

Figure 2:
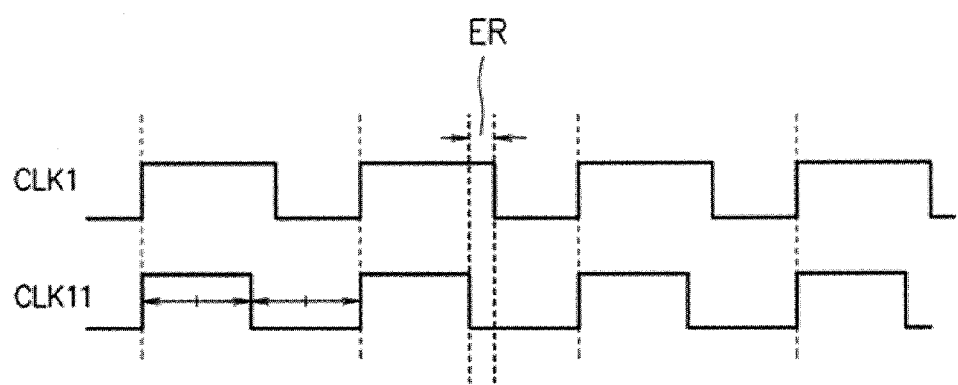
FIG. 2 illustrates an example clock signal.

FIG. 2 illustrates an example clock signal. In FIG. 2, a timing diagram of the clock signals CLK1 and CLK11 is illustrated. The duty ratio of the clock signal CLK1 may be, for example, 70%. The duty ratio of the clock signal CLK11 may be, for example, 50%. The duty ratio correction circuit 103 corrects the duty ratio of the clock signal CLK1 to generate the clock signal CLK11 that has a duty ratio of 50%. The duty ratio of the clock signal CLK1 may be 50%. Due to manufacturing variation in the size of a p-channel field effect transistor and an n-channel field effect transistor, an operation speed of the p-channel field effect transistor and the n-channel field effect transistor in a clock signal generation circuit or a buffer, for example, may vary, a duty error ER may occur, and the duty ratio may not reach 50%. For example, in a case when the operation speed of the p-channel field effect transistor is slower than the operation speed of the n-channel field effect transistor, the duty ratio of the clock signal CLK1 may become less than 50%. In a case when the operation speed of the n-channel field effect transistor is slower than the operation speed of the p-channel field effect transistor, the duty ratio of the clock signal CLK1 may become greater than 50%.

In FIG. 1B, data DT is illustrated by overlapping a variety of data transition patterns. The comparator 101 is synchronized with a rising edge of the clock signal CLK11 at a timing t1, and latches at a high level and outputs data DT1 when the data DT is higher than a common voltage, and latches at a low level and outputs the data DT1 when the data DT is lower than the common voltage. The comparator 102 is synchronized with a falling edge of the clock signal CLK11 at a timing t2, and latches at a high level and outputs data DT2 when the data DT is higher than the common voltage, and latches at a low level and outputs the data DT2 when the data DT is lower than the common voltage. The comparators 101 and 102 may be double-edged circuits, and may execute process in synchronization with both timings t1 and t2 of the rising edge and the falling edge of the clock signal CLK11. Since the clock signal CLK11 is corrected to have a duty ratio of 50%, the rising edge timing t1 and the falling edge timing t2 of the clock signal CLK11 may be located in a level stabilized period of the data DT. Therefore, correct data DT1 and DT2 may be reproduced.

Figure 3:
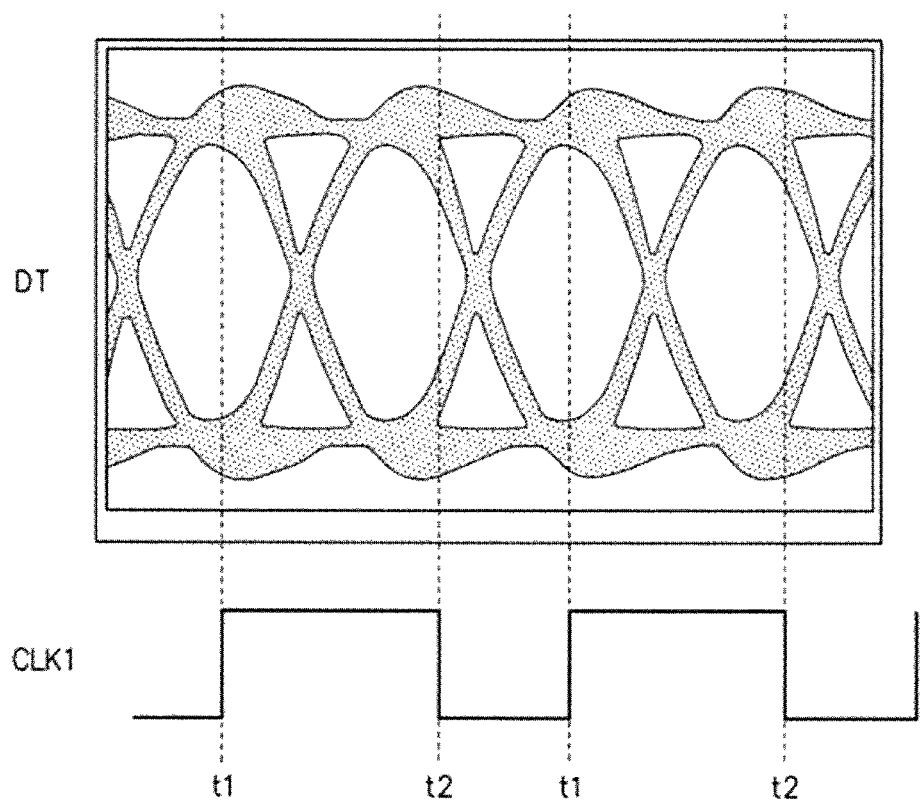
FIG. 3 illustrates an example operation of a comparator.

FIG. 3 illustrates an example operation of a comparator. In FIG. 3, a timing diagram in a case when the comparators 101 and 102 operate in synchronization with the clock signal CLK1, since there is no duty ratio correction circuit 103. The duty ratio of the clock signal CLK1 may be, for example, 70% and may have a longer high level period than a low level period. Therefore, a rising edge timing t1 of the clock signal CLK1 may be located in the level stabilized period of the data DT, while a falling edge timing t2 of the clock signal CLK1 may be located in a level unstabilized period of the data DT. The comparator 101 may be synchronized with a rising edge of the clock signal CLK1 at the timing t1, and may latch at a high level when the data DT is in a data stabilized period and is higher than a common voltage, and may latch at a low level when the data DT is lower than the common voltage to output stabilized data DT1. The comparator 102 may be synchronized with the falling edge of the clock signal CLK1 at the timing t2, and may latch at a high level when the data DT is in the level unstabilized period and the data DT is higher than the common voltage, and may latch at a low level when the data DT is lower than the common voltage and outputs unstabilized data DT2. The data error rate may increase.

Because the duty ratio correction circuit 103 corrects the duty ratio of a clock signal, stabilized data DT1 and DT2 may be output to reduce the data error rate.

Figure 4A:
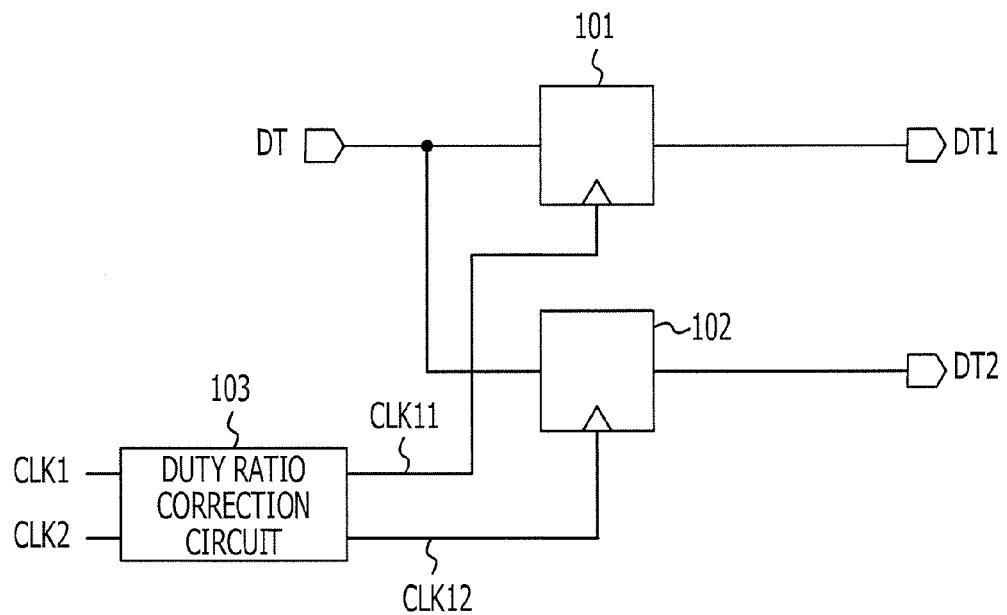
FIG. 4A illustrates an example double-edged device.
Figure 4B:
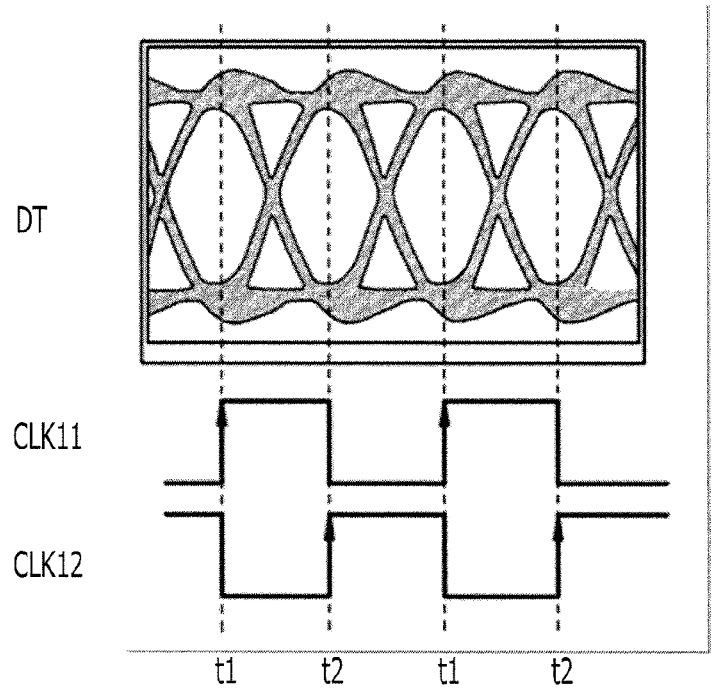
FIG. 4B illustrates an example operation of a double-edged device.

FIG. 4A illustrates an example double-edged device. FIG. 4B illustrates an example operation of a double-edged device. In FIG. 4B, a timing diagram of the double-edged device illustrated in FIG. 4A is illustrated. The double-edged device includes the duty ratio correction circuit 103 and the comparators 101 and 102. The duty ratio correction circuit 103 corrects a duty ratio of differential clock signals CLK1 and CLK2 whose phases are inverted with each other and outputs differential clock signals CLK11 and CLK12 whose phases are inverted with each other. For example, a duty ratio of the differential clock signals CLK1 and CLK2 that is not 50% may be corrected to a duty ratio of the differential clock signals CLK11 and CLK12 that is substantially 50%. The comparator 101 is synchronized with a rising edge of the clock signal CLK11 at a timing t1, and latches the data DT at a high level and outputs data DT1 when the data DT is higher than the common voltage, and latches the data DT at a low level and outputs data DT1 when the data DT is lower than the common voltage. The comparator 102 is synchronized with a rising edge of the clock signal CLK12 at a timing t2, and latches the data DT at a high level and outputs data DT2 when the data DT is higher than the common voltage, and latches the data DT at a low level and outputs data DT2 when the data DT is lower than the common voltage. The comparators 101 and 102 may be double-edged circuits and may execute process in synchronization with both timings t1 and t2 of the rising edge and the falling edge of the clock signal CLK11.

Since the differential clock signals CLK11 and CLK12 are corrected to have a duty ratio of 50%, the edge timings t1 and t2 of the clock signals CLK11 and CLK12 are located in a level stabilized period of the data DT. Therefore, correct data DT1 and DT2 may be reproduced.

Figure 5:
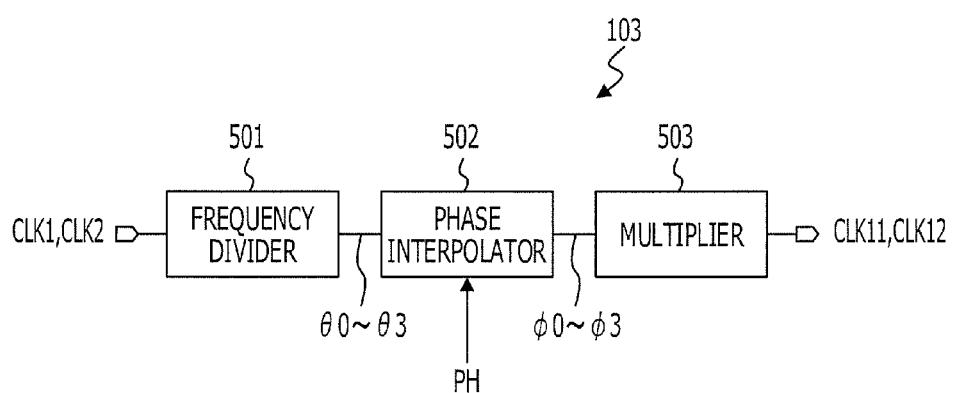
FIG. 5 illustrates an example duty ratio correction circuit.
Figure 6:
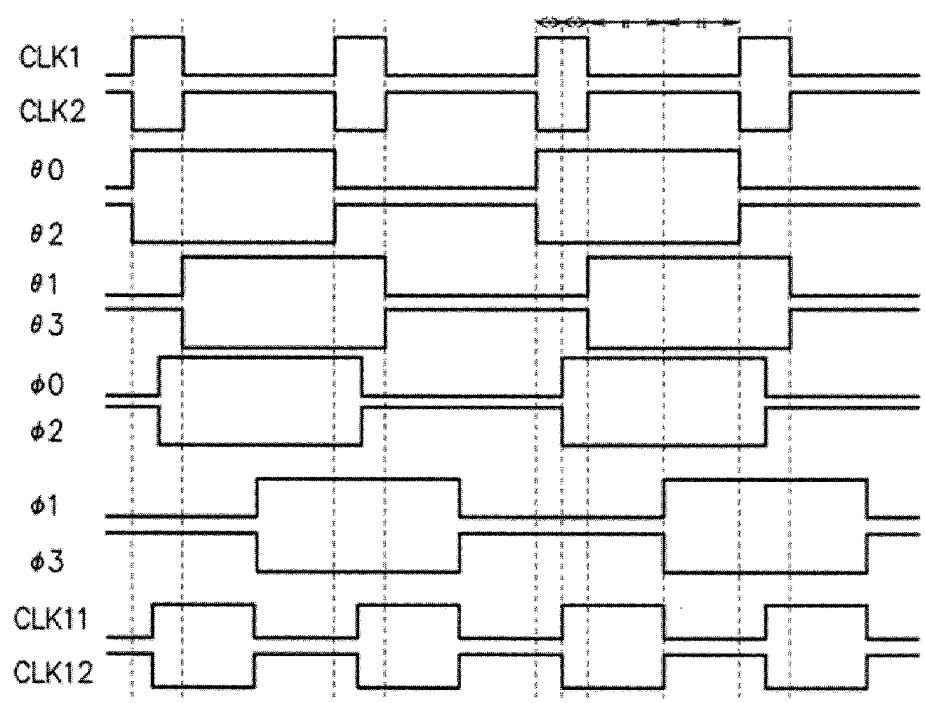
FIG. 6 illustrates an example operation of a duty ratio correction circuit.
Figure 7A:
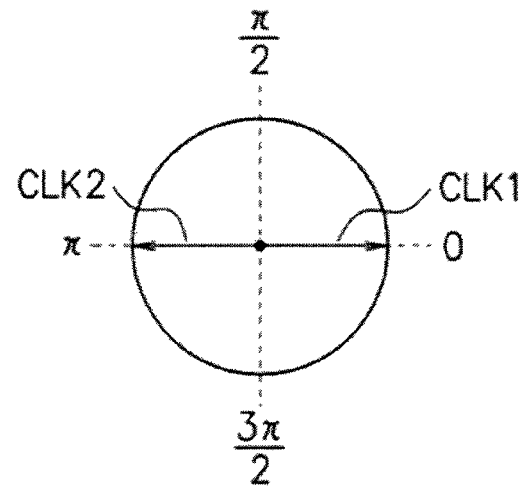
FIGS. 7A through 7C illustrate an example clock signal.
Figure 7B:
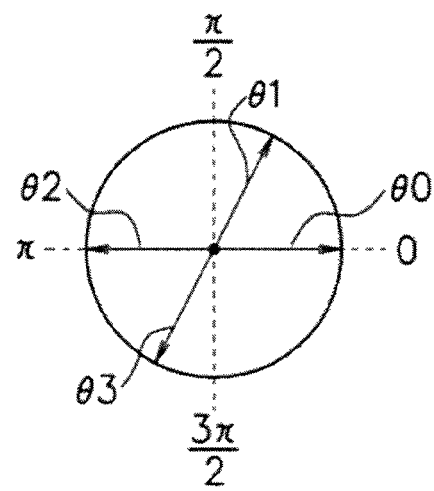
Figure 7C:
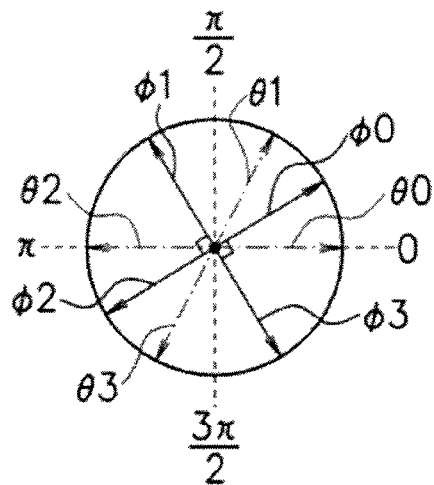

FIG. 5 illustrates an example duty ratio correction circuit. In FIG. 5, a configuration example of the duty ratio correction circuit 103 illustrated in FIG. 4A is illustrated. FIG. 6 illustrates an example operation of a duty ratio correction circuit. In FIG. 6, a timing diagram representing the operation of the duty ratio correction circuit 103 illustrated in FIG. 5 is illustrated. FIGS. 7A through 7C illustrate an example clock signal. In FIG. 7A, phases of the clock signals CLK1 and CLK2 are illustrated. FIG. 7B illustrates phases of clock signals θ0 through θ3. FIG. 7C illustrates phases of clock signals φ0 through φ3. The configuration of the duty ratio correction circuit 103 illustrated in FIG. 1A may be substantially the same as or similar to a configuration of a duty ratio correction circuit 103 illustrated in FIG. 5.

The duty ratio correction circuit 103 includes a frequency divider 501, a phase interpolator 502, and a multiplier 503. The frequency divider 501 divides the differential clock signals CLK1 and CLK2 and outputs clock signals θ0 through θ3 that are divided.

Figure 8:
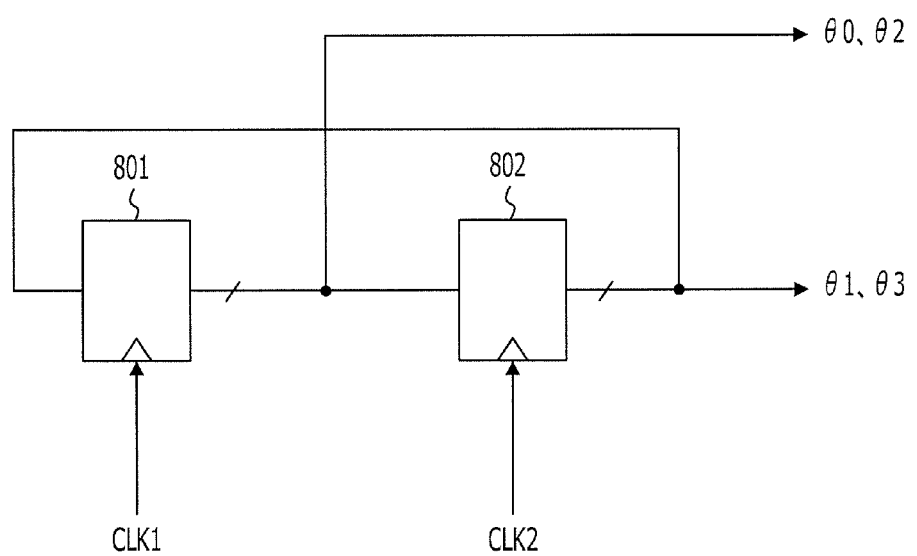
FIG. 8 illustrates an example frequency divider.

FIG. 8 illustrates an example frequency divider. The frequency divider illustrated in FIG. 8 may be the frequency divider 501 illustrated in FIG. 5. The frequency divider 501 has comparators 801 and 802. The comparator 801 outputs, for example, as illustrated in FIG. 6, the differential clock signals θ0 and θ2 having the levels that are inverted at each timing of the rising edge of the clock signal CLK1. The comparator 802 outputs, for example as illustrated in FIG. 6, the differential clock signals θ1 and θ3 having levels that are inverted at each timing of the rising edge of the clock signal CLK2 (at each timing of the falling edge of the clock signal CLK1). The frequency divider 501 divides the differential clock signals CLK1 and CLK2 into two and outputs the clock signals θ0 through θ3. Frequencies of the clock signals θ0 through θ3 may be ½ of the frequency of the clock signal CLK1 or CLK2.

As illustrated in FIG. 7A, the phase of the clock signal CLK1 may be 0 [rad], and the phase of the clock signal CLK2 may be π [rad]. The duty ratio of the clock signal CLK1 may be, for example, 20%, as illustrated in FIG. 6. As illustrated in FIG. 7B, the phase of the clock signal θ0 may be 0 [rad], and the phase of the clock signal θ2 may be π [rad]. For example, in a when that the duty ratio of the clock signal CLK1 is 50%, the phase of the clock signal θ1 may be π/2 [rad] and the phase of the clock signal θ3 may be 3π/2 [rad]. For example, in a case when the duty ratio of the clock signal CLK1 is lower than 50%, as illustrated in FIG. 7B, the phase of the clock signal θ1 may become less than π/2 [rad] and the phase of the clock signal θ3 may become less than 3π/2 [rad]. The clock signals θ0 and θ2 may be differential clock signals that have phases inverted to each other. The clock signals θ1 and θ3 may be differential clock signals that have phases inverted to each other.

The phase interpolator 502 illustrated n FIG. 5 interpolates the phases of the clock signals θ0 through θ3 in accordance with a phase code PH to generate clock signals φ0 through φ3. The phase code PH may correspond to a weighting factor and may be, for example, ½.

As illustrated in FIG. 7C, the phase interpolator 502 interpolates the phases of the clock signals θ0 and θ1 to generate the clock signal φ0. For example, the phase interpolator 502 multiplies the clock signal θ0 by a weighting factor of "½", multiplies the clock signal θ1 by the weighting factor of "½", and adds the results to generate the clock signal φ0.

The phase interpolator 502 interpolates the phases of the clock signals θ1 and θ2 to generate the clock signal φ1. For example, the phase interpolator 502 multiplies the clock signal θ1 by a weighting factor of "½", multiplies the clock signal θ2 by the weighting factor of "½", and adds the results to generate the clock signal φ1.

The phase interpolator 502 interpolates the phases of the clock signals θ2 and θ3 to generate the clock signal φ2. For example, the phase interpolator 502 multiplies the clock signal θ2 by a weighting factor of "½", multiplies the clock signal θ3 by the weighting factor of "½", and adds the results to generate the clock signal φ2.

The phase interpolator 502 interpolates the phases of the clock signals θ3 and θ0 to generate the clock signal φ3. For example, the phase interpolator 502 multiplies the clock signal θ3 by a weighting factor of "½", multiplies the clock signal θ0 by the weighting factor of "½", and adds the results to generate the clock signal φ3.

The generated four-phase clock signals φ0 through φ3 may be clock signals that have the phases shifted to each other by each π/2 [rad]. The phase interpolator 502 generates the clock signals φ0 through φ3 that have the phases shifted with respect to each other by each π/2 [rad] based on the clock signal CLK1 that has a duty ratio not equal to 50%. The phase interpolator 502 carries out phase interpolation on the clock signals θ0 through θ3 that are generated by the frequency divider 501 and have low frequencies. Therefore, the frequency bandwidth limitation may be alleviated and the operation may become fast.

The multiplier 503 illustrated in FIG. 5 outputs an exclusive OR signal of the clock signals φ0 and φ1 as clock signal CLK11 as illustrated in FIG. 6, and outputs an exclusive OR signal of the clock signals φ2 and φ3 as clock signal CLK12. The clock signals CLK11 and CLK12 may be differential signals having phases that are inverted with respect to each other. Therefore, the multiplier 503 generates the clock signals CLK11 and CLK12 that are obtained by multiplying the clock signals φ0 through φ3 by 2. The frequencies of the clock signals CLK11 and CLK12 may be twice the frequencies of the clock signals φ0 through φ3 and may be the same frequencies as those of the clock signals CLK1 and CLK2. As illustrated in FIG. 7C, the phase difference between the clock signals φ0 and φ1 may be π/2 [rad] and the phase difference between the clock signals φ2 and φ3 may be π/2 [rad]. Therefore, the duty ratio of the differential clock signals CLK11 and CLK12 may become 50%.

The frequency divider 501 lowers a frequency of a clock signal. The phase interpolator 502 carries out phase interpolation on the clock signals θ0 through θ3 that have low frequencies. Therefore, the frequency bandwidth limitation may be alleviated and the multiplier 503 may return the clock signal to the original frequency. The duty ratio correction circuit 103 corrects the duty ratio of the differential clock signals CLK1 and CLK2 to generate the differential clock signals CLK11 and CLK12 that have a duty ratio of substantially 50%.

In the duty ratio correction circuit 103 illustrated in FIG. 1A, the clock signals CLK2, θ2, θ3, φ2, φ3, and CLK12 may not be used.

Figure 9A:
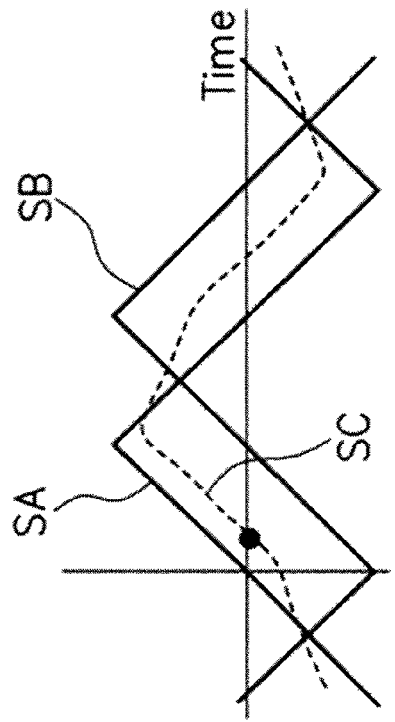
FIG. 9A illustrates an example phase interpolation unit.
Figure 9B:
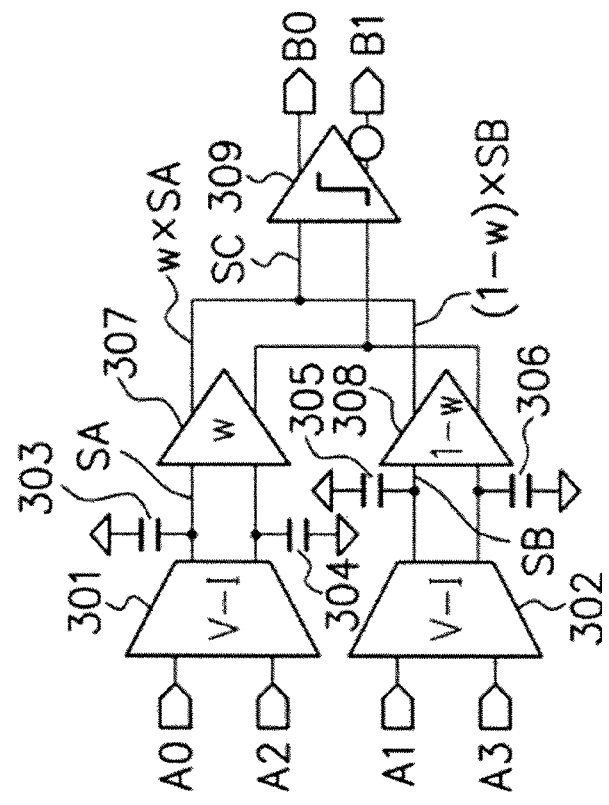
FIG. 9B illustrates an example operation of a phase interpolation unit.

FIG. 9A illustrates an example phase interpolation unit. FIG. 9A illustrates a phase interpolation unit in the phase interpolator 502 illustrated in FIG. 5. FIG. 9B illustrates an example operation of a phase interpolation unit. FIG. 9B illustrates a timing diagram of the phase interpolation unit in FIG. 9A. The phase interpolation unit includes four input terminals A0 through A3 and two output terminals B0 and B1. When the clock signal θ0 is input to the input terminal A0, the clock signal θ2 is input to the input terminal A2, the clock signal θ1 is input to the input terminal A1, and the clock signal θ3 is input to the input terminal A3, then the clock signal φ0 is output from the output terminal B0 and the clock signal φ2 is output from the output terminal B1.

A voltage current conversion circuit 301 converts the differential clock signals θ0 and θ2 that are input to the differential input terminals A0 and A2 from a voltage to a current and outputs the current to capacities 303 and 304. Therefore, a triangular wave signal SA illustrated in FIG. 9B and the like are generated. A differential amplifier 307 amplifies the signal SA and the like that are accumulated in the capacities 303 and 304 with a weighting factor w and outputs a signal w×SA and a phase inverted signal thereof. The weighting factor w may correspond to the phase code PH illustrated in FIG. 5 and may be ½.

A voltage current conversion circuit 302 converts the differential clock signals θ1 and θ3 that are input to the differential input terminals A1 and A3 from a voltage to a current and outputs the current to capacities 305 and 306. Therefore, a triangular wave signal SB illustrated in FIG. 9B and the like are generated. A differential amplifier 308 amplifies the signal SB and the like that are accumulated in the capacities 305 and 306 with a weighting factor 1−w and outputs a signal (1−w)×SB and a phase inverted signal thereof.

A comparator 309 receives a composite signal SC of output signals of the differential amplifiers 307 and 308 and the like. The signal SC may be a composite signal of the signal w×SA and the signal (1−w)×SB, and may be represented by w×SA+(1−w)×SB. The comparator 309 outputs the signal φ0 and a logically inverted signal φ2 in accordance with a result of comparing the two input signals to the output terminals B0 and B1. The comparator 309 outputs a signal φ0 at a high level to the output terminal B0 when one signal of the two input signals is greater relative to the other signal, and outputs the signal φ0 at a low level to the output terminal B0 when the same signal is smaller than the other. For example, the comparator 309 outputs the input signal SC by converting it to the rectangular wave signal φ0.

Figure 10:
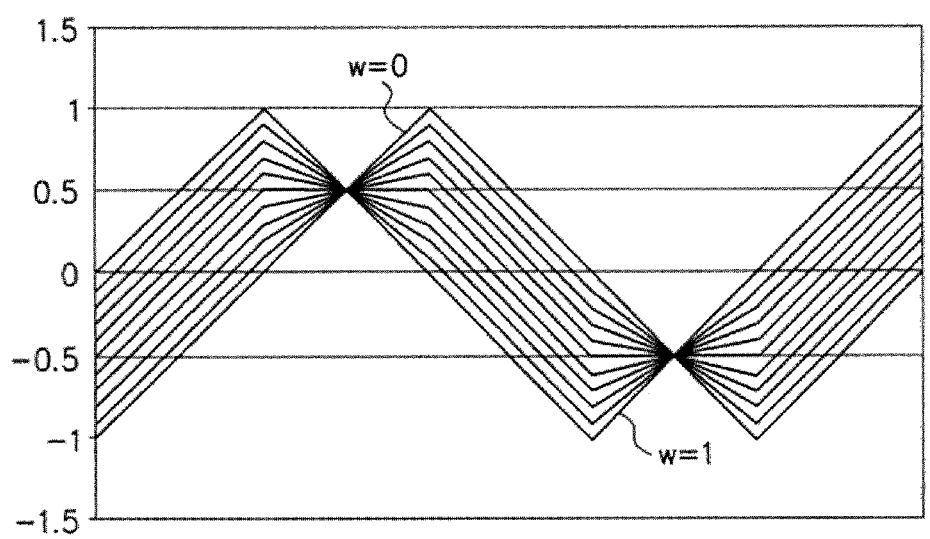
FIG. 10 illustrates an example composite signal.

FIG. 10 illustrates an example composite signal. FIG. 10 may illustrate a waveform of the composite signal SC in accordance with the weighting factor w. When the weighting factor w is 0, the composite signal SC may be substantially the same signal as the signal SA. When the weighting factor w is 1, the composite signal SC may be substantially the same signal as the signal SB. When the weighting factor w is ½, the composite signal SC may be a phase that is intermediate between the signals SA and SB.

Figure 11A:
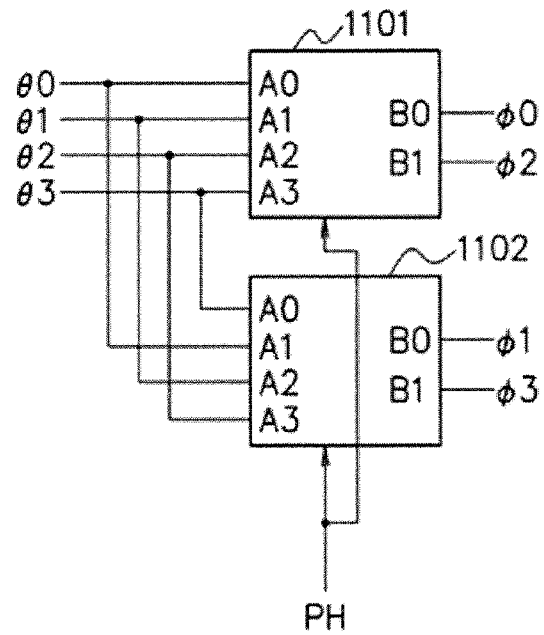
FIG. 11A illustrates an example phase interpolator.

FIG. 11A illustrates an example phase interpolator. For example, FIG. 11A may illustrate the phase interpolator 502 illustrated in FIG. 5. Phase interpolation units 1101 and 1102 may have a configuration, respectively, that is substantially the same as or similar to the configuration illustrated in FIG. 9A. The phase interpolation units 1101 and 1102 include the four input terminals A0 through A3 and the two output terminals B0 and B1 and receive the phase code PH. The phase interpolation unit 1101 receives the clock signal θ0 at the input terminal A0, receives the clock signal θ1 at the input terminal A1, receives the clock signal θ2 at the input terminal A2, receives the clock signal θ3 at the input terminal A3, outputs the clock signal φ0 from the output terminal B0, and outputs the clock signal φ2 from the output terminal B1. The phase interpolation unit 1102 receives the clock signal θ3 at the input terminal A0, receives the clock signal θ0 at the input terminal A1, receives the clock signal θ1 at the input terminal A2, receives the clock signal θ2 at the input terminal A3, outputs the clock signal φ1 from the output terminal B0, and outputs the clock signal φ3 from the output terminal B1.

Figure 11B:
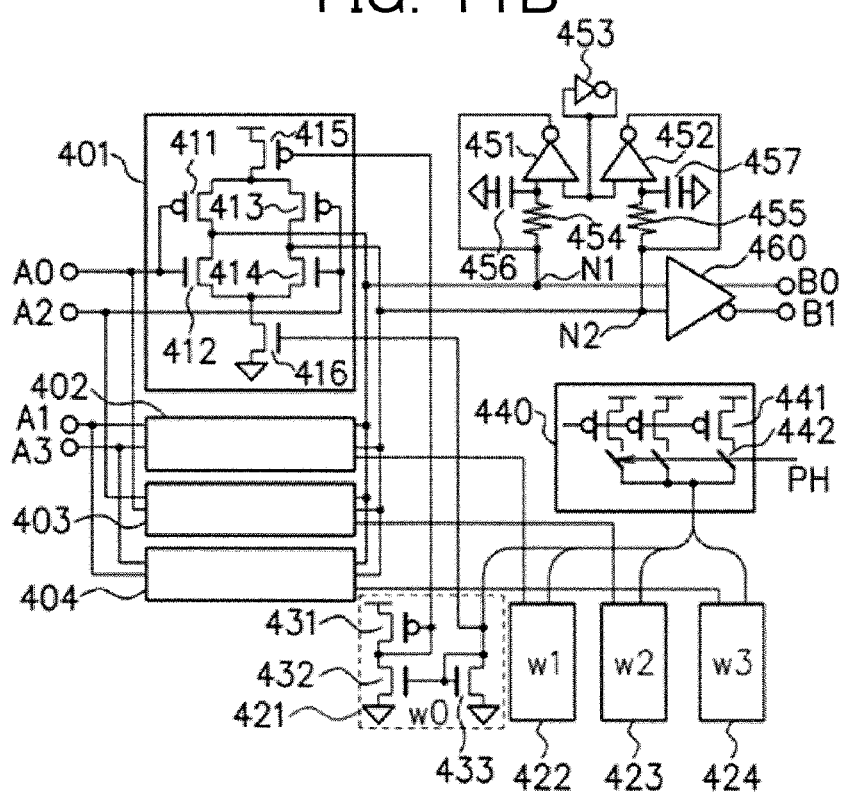
FIG. 11B illustrates an example phase interpolation unit.

FIG. 11B illustrates an example phase interpolation unit. FIG. 11B illustrates the phase interpolation unit illustrated in FIG. 9A. A current digital analog converter 440 includes a series connection circuit of a plurality of p-channel field effect transistors 441 and switches 442 that are coupled in parallel. The gates of the transistors 441 are coupled to fixed bias potential nodes. In accordance with the phase code PH, the plurality of switches 442 are turned on or off. The current digital analog converter 440 outputs an analog current of weighting factors w0 through w3 in accordance with the phase code PH to circuits 421 through 424.

The circuit 421 of the weighting factor w0 includes field effect transistors 431 through 433. The source of the p-channel field effect transistor 431 is coupled to a power supply potential node and the gate is coupled to the drain. The drain of the n-channel field effect transistor 432 is coupled to the drain of the transistor 431, the gate is coupled to an output terminal of the current digital analog converter 440, and the source is coupled to a ground potential node. The drain and the gate of the n-channel field effect transistor 433 are coupled to the output terminal of the current digital analog converter 440 and the source is coupled to a ground potential node.

The circuits 422 through 424 of the weighting factors w1 through w3 may have a configuration that is substantially the same as or similar to the configuration of the circuit 421 of the weighting factor w0, and may receive analog currents of the weighting factors w1 through w3 from the current digital analog converter 440. The circuits 421 through 424 output voltages of the weighting factors w0 through w3 to voltage current conversion circuits 401 through 404.

Since elements 451 through 457 are coupled to nodes N1 and N2, the center voltage of the signal waveforms at the nodes N1 and N2 is set at a desired level and the nodes N1 and N2 may become capacitive nodes. The node N1 is coupled to a ground potential node via the resistor 454 and the capacity 456, and the node N2 is coupled to a ground potential node via the resistor 455 and the capacity 457.

The voltage current conversion circuit 401 includes field effect transistors 411 through 416. The source of the p-channel field effect transistor 415 is coupled to a power supply potential node and the gate is coupled to the drain of the p-channel field effect transistor 431 in the circuit 421. The source of the n-channel field effect transistor 416 is coupled to the ground potential node and the gate is coupled to the drain of the transistor 433 in the circuit 421. The source of the p-channel field effect transistor 411 is coupled to the drain of the transistor 415, the gate is coupled to the input terminal A0, and the drain is coupled to the node N1. The drain of the n-channel field effect transistor 412 is connected to the node N1, the gate is coupled to the input terminal A0, and the source is coupled to the drain of the transistor 416. The source of the p-channel field effect transistor 413 is coupled to the drain of the transistor 415, the gate is coupled to the input terminal A2, and the drain is coupled to the node N2. The drain of the n-channel field effect transistor 414 is coupled to the node N2, the gate is coupled to the input terminal A2, and the source is coupled to the drain of the transistor 416.

The voltage current conversion circuits 402 through 404 may have a configuration that is substantially the same as or similar to the configuration of the voltage current conversion circuit 401, and may be coupled respectively to the circuits 422 through 424. The voltage current conversion circuit 402 receives clock signals of the input terminals A1 and A3, the voltage current conversion circuit 403 receives clock signals of the input terminals A2 and A0, and the voltage current conversion circuit 404 receives clock signals of the input terminals A3 and A1.

The voltage current conversion circuits 401 through 404 output the currents that are amplified by the weighting factors w0 through w3 to the capacitive nodes N1 and N2, thereby generating a triangular wave for addition. A comparator 460 outputs a rectangular wave clock signal to the output terminals B0 and B1 similar to the comparator 309 illustrated in FIG. 9A.

FIGS. 12A through 12D illustrate an example multiplier. FIGS. 12A through 12D may be the multiplier 503 illustrated in FIG. 5. The clock signal CLK11 may be an exclusive OR signal of the clock signals φ0 and φ1 and is represented by CLK11=φ2·φ1+φ3·φ0. The clock signal CLK12 may be a logically inverted signal of the clock signal CLK11 and is represented by CLK12=φ2·φ3+φ1·φ0. The frequencies of the clock signals CLK11 and CLK12 may be twice the frequencies of the clock signals φ0 through φ3.

The multiplier 503 illustrated in FIG. 12A includes n-channel field effect transistors 1211 through 1214 and a resistor 1201, receives the clock signals φ0 through φ3, and outputs the clock signal CLK11.

The multiplier 503 illustrated in FIG. 12B includes the n-channel field effect transistors 1211 through 1214 and the resistor 1201, receives the clock signals φ0 through φ3, and outputs the clock signal CLK12.

The multiplier 503 illustrated in FIG. 12C includes n-channel field effect transistors 1211 through 1218, resistors 1201 and 1202, and a current source 1231, receives the clock signals φ0 through φ3, and outputs the clock signals CLK11 and CLK12.

The multiplier 503 illustrated in FIG. 12D includes the n-channel field effect transistors 1211 through 1218, p-channel field effect transistors 1219 through 1226, resistors 1203, and current sources 1231 and 1232, receives the clock signals φ0 through φ3, and outputs the clock signals CLK11 and CLK12.

Figure 13:
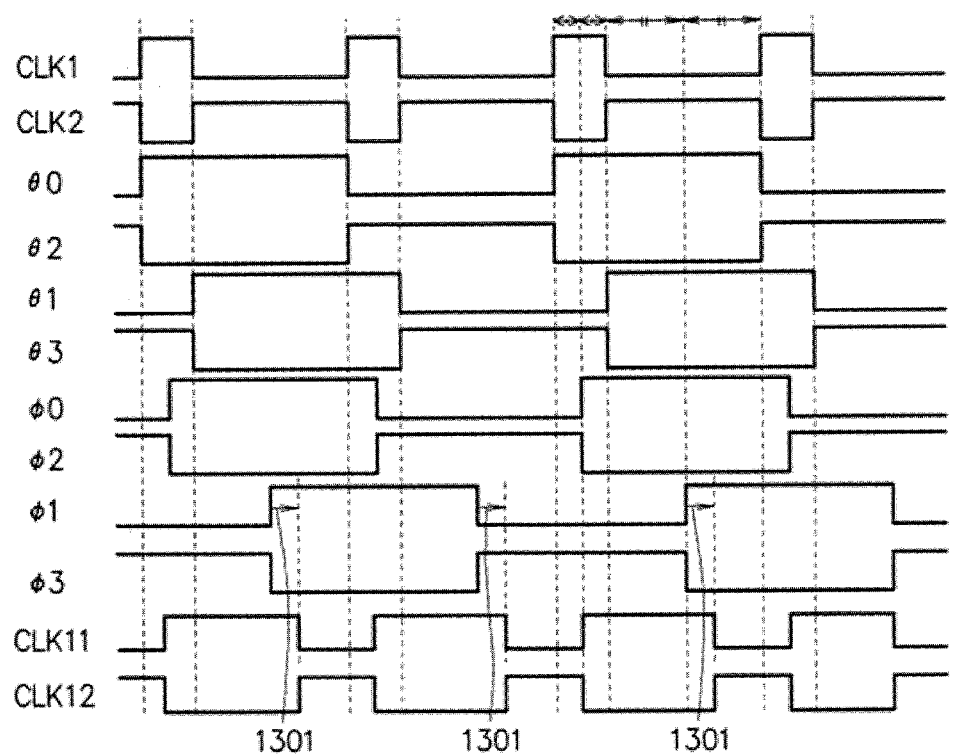
FIG. 13 illustrates an example operation of a phase interpolator.

FIG. 13 illustrates an example operation of a phase interpolator. FIG. 13 may correspond to, for example, FIG. 6 and may illustrate a timing diagram in which skew errors 1301 occur based on an error of the phase interpolator 502 illustrated in FIG. 5. In a case that there is an error in the phase interpolator 502, the phase difference between the clock signals φ0 and φ1 may not be π/2 [rad] and the duty ratio of the differential clock signals CLK11 and CLK12 may not reach 50%. In FIG. 13, the phase difference between the clock signals φ0 and φ1 becomes greater than π/2 [rad], the duty ratio of the clock signal CLK11 becomes greater than 50%, and an error may occur in correction of the duty ratio. The duty ratio may be corrected to substantially 50%.

Figure 14:
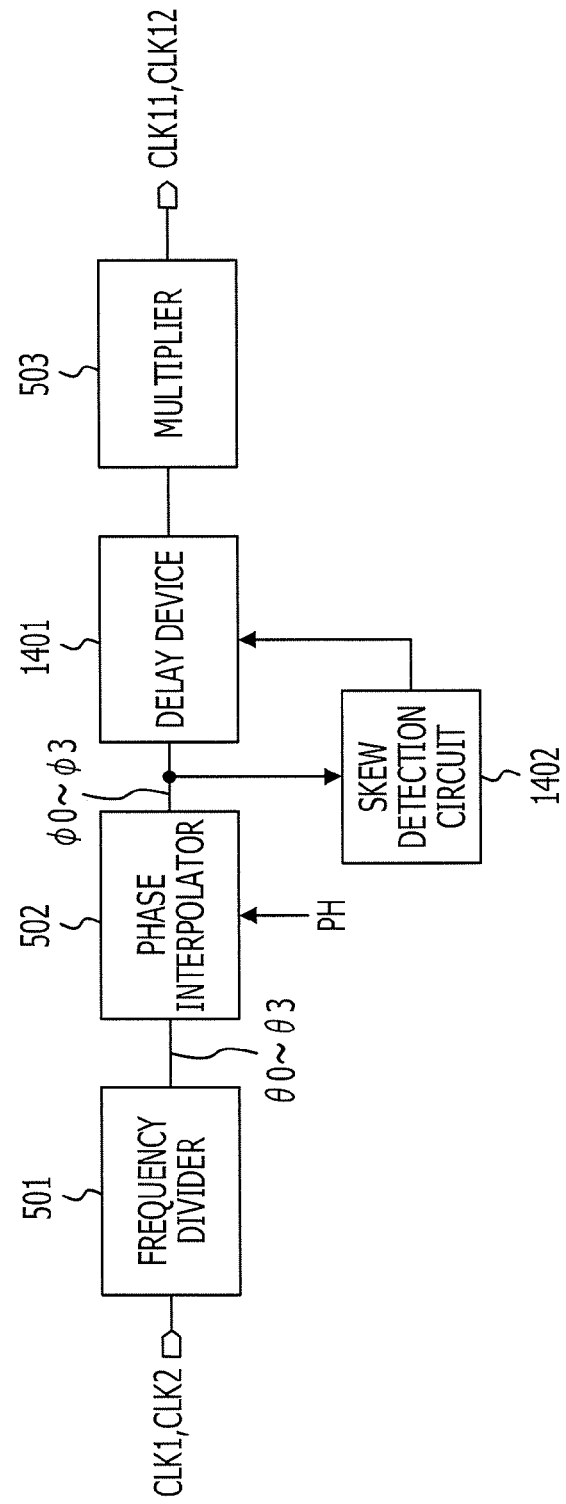
FIG. 14 illustrates an example duty ratio correction circuit.

FIG. 14 illustrates an example duty ratio correction circuit. In FIG. 14, a delay device 1401 and a skew detection circuit 1402 are added to the circuit illustrated in FIG. 5. Other elements illustrated in FIG. 14 may be substantially the same as or similar to the elements illustrated in FIG. 5.

The skew detection circuit 1402 detects the skew error 1301 in FIG. 13. For example, the skew detection circuit 1402 may be a phase difference detector and may detect the phase difference between the clock signals φ0 and φ1 that is generated by the phase interpolator 502. The delay device 1401 delays the differential clock signals φ0 and φ2 or the differential clock signals φ1 and φ3, in such a manner that the phase difference that is detected by the skew detection circuit 1402 becomes π/2 [rad], to output them to the multiplier 503. For example, in FIG. 13, since the phase difference between the clock signals φ0 and φ1 is greater than π/2 [rad], the differential clock signals φ0 and φ2 are delayed in such a manner that the phase difference becomes π/2 [rad]. Therefore, since the clock signals φ0 through φ3 are adjusted to have the phases shifted to each other for each π/2 [rad], the duty ratio of the clock signals CLK11 and CLK12 may become substantially 50%.

Figure 15:
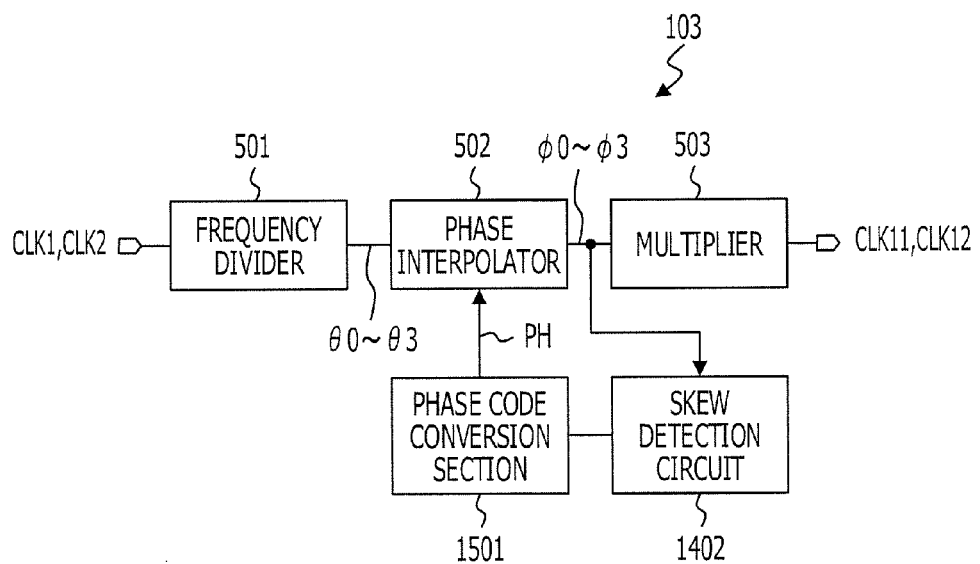
FIG. 15 illustrates an example duty ratio correction circuit.
Figure 16:
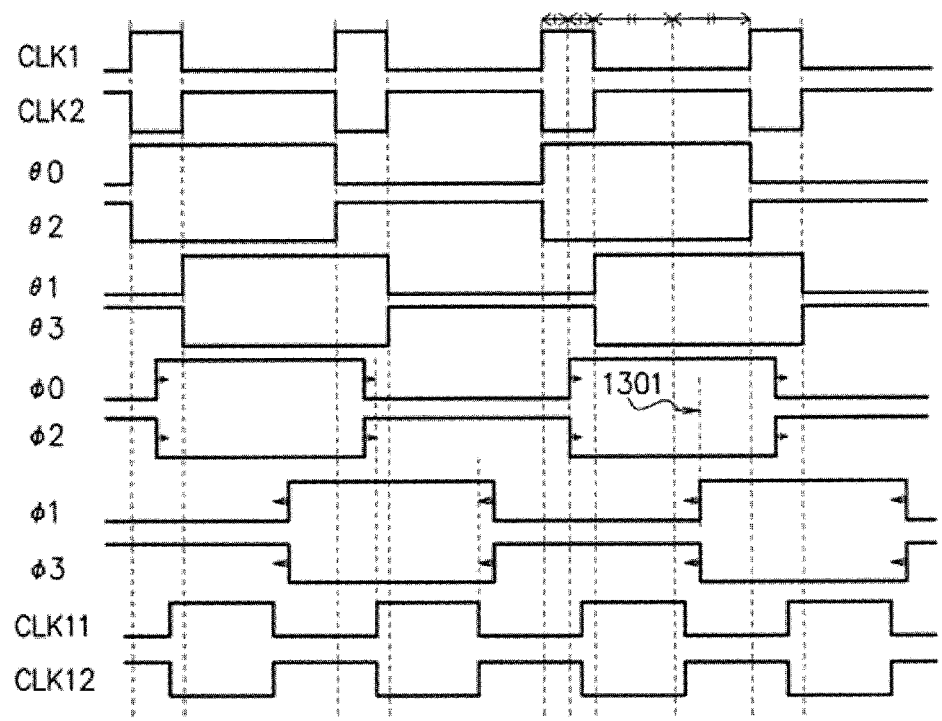
FIG. 16 illustrates an example operation of a duty ratio correction circuit.

FIG. 15 illustrates an example duty ratio correction circuit. FIG. 16 illustrates an example operation of a duty ratio correction circuit. FIG. 16 may illustrate a timing diagram of the duty ratio correction circuit 103 illustrated in FIG. 15. In FIG. 15, the skew detection circuit 1402 and a phase code conversion section 1501 are added to the circuit illustrated in FIG. 5. In FIG. 15, the remaining elements may be substantially the same as or similar to the elements illustrated in FIG. 5.

The skew detection circuit 1402 illustrated in FIG. 15 may be substantially the same as the skew detection circuit 1402 illustrated in FIG. 14. The skew detection circuit 1402 may be a phase difference detector and detects the phase difference between the clock signals φ0 and φ1 that are generated by the phase interpolator 502. The phase code conversion section 1501 outputs the phase code PH in accordance with the phase difference that is detected by the skew detection circuit 1402 in such a manner that the phase difference between the clock signals φ0 and φ1 generated by the phase interpolator 502 becomes π/2 [rad]. The phase interpolator 502 carries out phase interpolation with the weighting factor w in accordance with the phase code PH. Therefore, the phase difference between the clock signals φ0 and φ1 that is output by the phase interpolator 502 becomes π/2 [rad].

For example, in FIG. 16, the phase code conversion section 1501 outputs a phase code PH of "½+α" to the phase interpolation unit 1101 illustrated in FIG. 11A, thereby delaying the phases of the clock signals φ0 and φ2. The phase code conversion section 1501 outputs a phase code PH of "½−α" to the phase interpolation unit 1102 illustrated in FIG. 11A, thereby advancing the phases of the clock signals φ1 and φ3. A phase code PH of "½" may also be output to the phase interpolation unit 1101, a phase code PH of "½−2×α" may also be output to the phase interpolation unit 1102, a phase code PH of "½+2×α" may also be output to the phase interpolation unit 1101, and a phase code PH of "½" may also be output to the phase interpolation unit 1102. Since the phase interpolator 502 is high in accuracy of phase interpolation with a phase code PH of near "½", the control illustrated in FIG. 16 may be carried out.

The clock signal φ2 may be an inverted signal of the clock signal φ0, and the clock signal φ3 may be an inverted signal of the clock signal φ1. Therefore, the clock signals φ0 through φ3 have the phases shifted for each π/2 [rad]. Therefore, the duty ratio of the clock signals CLK11 and CLK12 that are output by the multiplier 503 may become substantially 50%.

Figure 17:
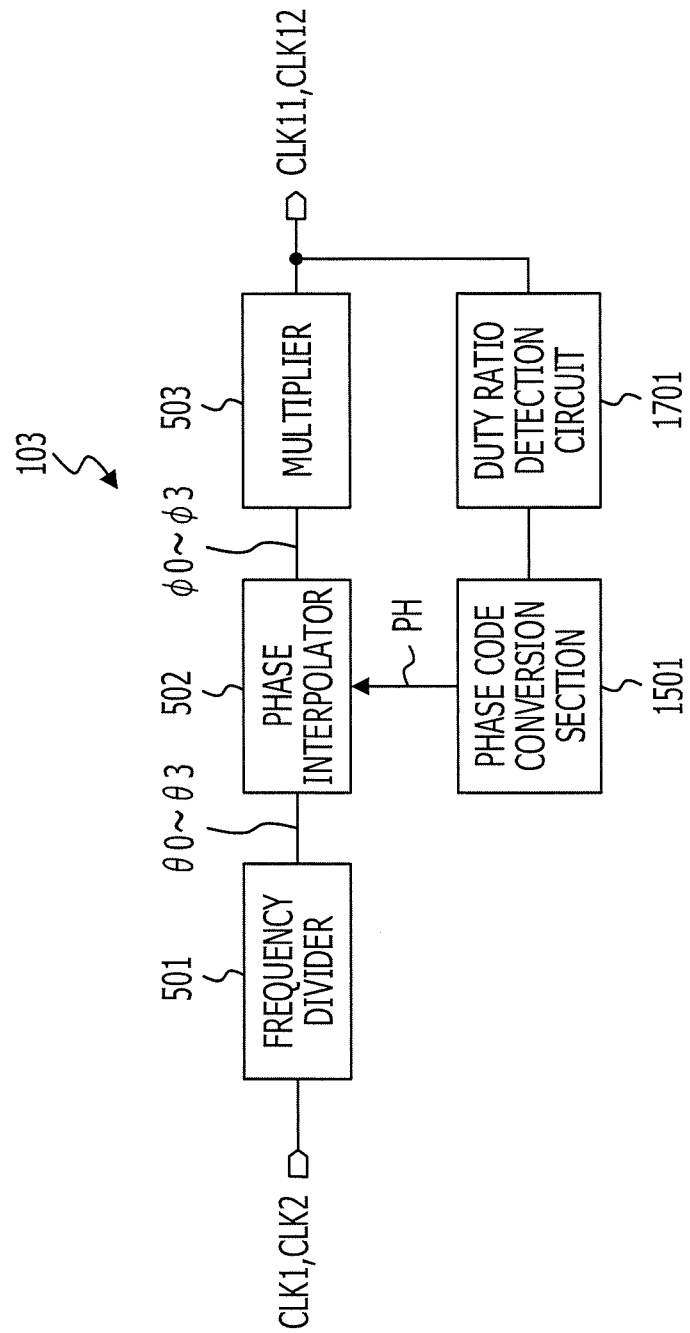
FIG. 17 illustrates an example duty ratio correction circuit.

FIG. 17 illustrates an example duty ratio correction circuit. The duty ratio correction circuit 103 illustrated in FIG. 17 may correct an error of the phase interpolator 502 and the multiplier 503. In a case that the multiplier 503 has an error, the duty ratio of the clock signals CLK11 and CLK12 may not equal 50% even when the phase difference between the clock signals φ0 and φ1 is π/2 [rad]. A duty ratio detection circuit 1701 detects the duty ratio of the clock signal CLK11 (or CLK12) that is output by the multiplier 503. The phase code conversion section 1501 outputs the phase code PH in accordance with the duty ratio that is detected by the duty ratio detection circuit 1701 in such a manner that the duty ratio of the clock signals CLK11 and CLK12 that are output by the multiplier 503 becomes substantially 50%. The phase interpolator 502 carries out phase interpolation with the weighting factor w in accordance with the phase code PH. Therefore, the duty ratio of the clock signals CLK11 and CLK12 that are outputted by the multiplier 503 may become substantially 50%.

Figure 18A:
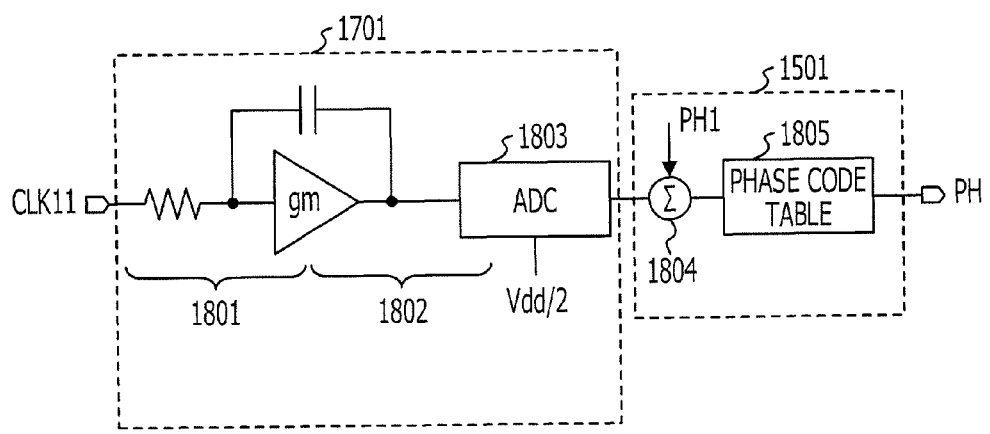
FIG. 18A illustrates an example duty ratio detection circuit and an example phase code conversion section.
Figure 18B:
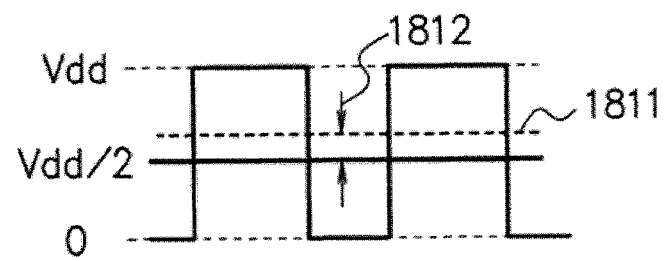
FIG. 18B illustrates an example clock signal.

FIG. 18A illustrates an example duty ratio detection circuit and a phase code conversion section. In FIG. 18A, the duty ratio detection circuit 1701 and the phase code conversion section 1501 that are illustrated in FIG. 17 are illustrated. FIG. 18B illustrates one example of a clock signal. FIG. 18B may illustrate a voltage waveform of the clock signal CLK11. The duty ratio detection circuit 1701 includes a low pass filter 1801, an integrator 1802, and an analog digital converter 1803. The phase code conversion section 1501 includes an adder 1804 and a phase code table 1805.

For example, as illustrated in FIG. 18B, the duty ratio of the clock signal CLK11 is greater than 50%. The low pass filter 1801 blocks a high frequency component of the clock signal CLK11 and lets a low frequency component pass through for output. The integrator 1802 integrates the output signal of the low pass filter 1801 and, as illustrated in FIG. 18B, outputs an average voltage 1811 of the clock signal CLK11. In a case when the duty ratio of the clock signal CLK11 is 50%, the average voltage 1811 may be Vdd/2. In a case when the duty ratio of the clock signal CLK11 is greater than 50%, the average voltage 1811 may be higher than Vdd/2. In a case when the duty ratio of the clock signal CLK11 is lower than 50%, the average voltage 1811 may be lower than Vdd/2.

The analog digital converter 1803 converts the average voltage 1811 from analog to digital for output in such a manner that the voltage Vdd/2 becomes a digital value of "0". The adder 1804 adds a phase code PH1 corresponding to "½" to the output digital value of the analog digital converter 1803 for output. A multiplier may also be provided in a later stage of the analog digital converter 1803 to appropriately set a loop gain of a feedback and to reduce oscillation.

FIG. 19 illustrates an example phase code table. FIG. 19 illustrates the phase code table 1805 illustrated in FIG. 18A. The phase code table 1805 stores corresponding relationship between the phase codes PH, the phases, and the delay times. The phase code table 1805 outputs the phase code PH in accordance with an output value of the adder 1804, as illustrated in FIG. 18B, in such a manner that a differential voltage 1812 between the average voltage 1811 and a reference voltage of "Vdd/2" becomes 0 V.

Figure 20:
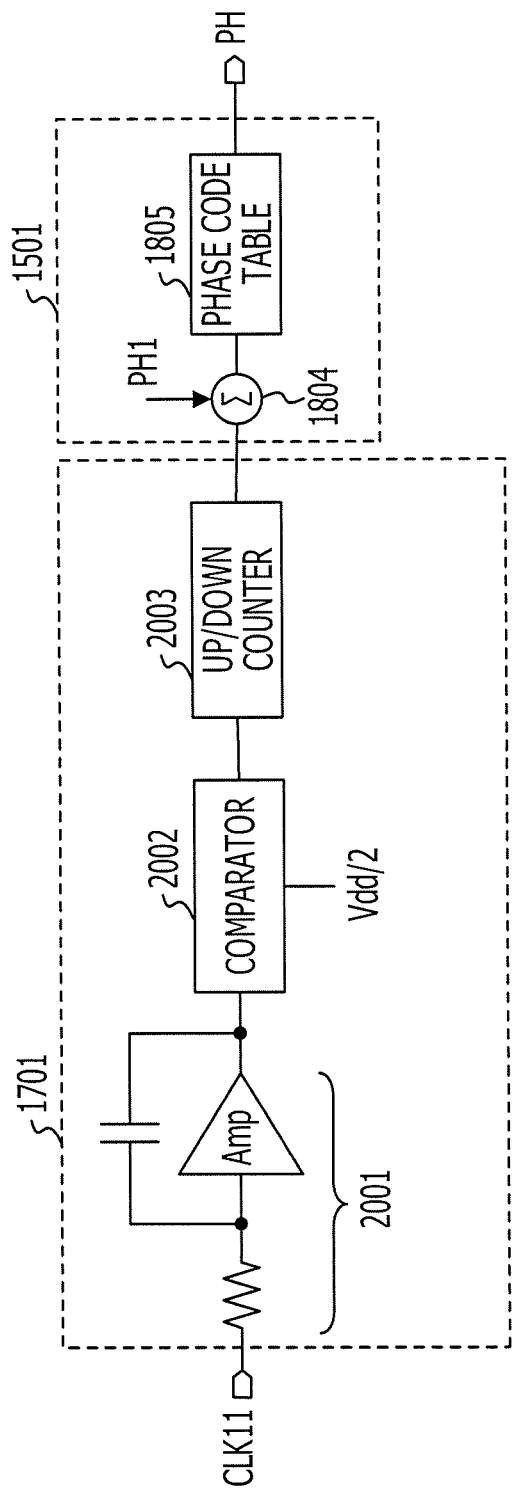
FIG. 20 illustrates an example duty ratio detection circuit and an example phase code conversion section.

FIG. 20 illustrates an example duty ratio detection circuit and an example phase code conversion section. In FIG. 20, the duty ratio detection circuit 1701 and the phase code conversion section 1501 that are illustrated in FIG. 17 are illustrated. The duty ratio detection circuit 1701 includes a low pass filter 2001, a comparator 2002, and an up/down counter 2003. The phase code conversion section 1501 includes the adder 1804 and the phase code table 1805. In FIG. 20, the remaining elements may be substantially the same as or similar to the elements illustrated in FIG. 18A.

The low pass filter 2001 blocks a high frequency component of the clock signal CLK11 and lets a low frequency component pass through, thereby outputting the average voltage 1811 of the clock signal CLK11 as illustrated in FIG. 18B. The comparator 2002 outputs an up signal when the average voltage 1811 is higher than the reference voltage Vdd/2, and outputs a down signal when the average voltage 1811 is lower than the reference voltage Vdd/2. The up/down counter 2003 increments a count value as the comparator 2002 outputs an up signal, and decrements the count value as the comparator 2002 outputs a down signal, and outputs the count value to the adder 1804. The up/down counter 2003 may function as an integrator, and may increase a feedback gain. The duty ratio detection circuit 1701 and the phase code conversion section 1501 illustrated in FIG. 20 may achieve functions that are substantially the same as or similar to those of the duty ratio detection circuit 1701 and the phase code conversion section 1501 illustrated in FIG. 18A.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A duty ratio correction circuit, comprising:
    a frequency divider configured to output a second clock signal having a first level that is inverted at a timing of a first edge of a first clock signal and a third clock signal having a second level that is inverted at a timing of a second edge of the first clock signal;
    a phase interpolator configured to generate a fourth clock signal and a fifth clock signal based on phase interpolation of any two of the second clock signal, the third clock signal, a first inverted signal that is obtained by inverting the second clock signal, or a second inverted signal that is obtained by inverting the third clock signal; and
    a multiplier configured to output an exclusive OR signal of the fourth clock signal and the fifth clock signal as a sixth clock signal.

2. The duty ratio correction circuit according to claim 1, wherein
    the first edge corresponds to a rising edge of the first clock signal, and
    the second edge corresponds to a falling edge of the first clock signal.

3. The duty ratio correction circuit according to claim 1, wherein
    the phase interpolator generates the fourth clock signal by phase interpolation of the second clock signal and the third clock signal and generates the fifth clock signal by phase interpolation of the third clock signal and the first inverted signal.

4. The duty ratio correction circuit according to claim 1, wherein
    the phase interpolator generates a seventh clock signal by phase interpolation of the first inverted signal and the second inverted signal and generates an eighth clock signal by phase interpolation of the second inverted signal and the second clock signal, and
    the multiplier outputs an exclusive OR signal of the seventh clock signal and the eighth clock signal as a ninth clock signal.

5. The duty ratio correction circuit according to claim 1, further comprising:
    phase difference detector configured to detect phase difference between the fourth clock signal and the fifth clock signal; and
    a delay circuit configured to delay one of the fourth clock signal and the fifth clock signal based on the phase difference and outputs a delayed signal to the multiplier.

6. The duty ratio correction circuit according to claim 1, further comprising,
    phase difference detector configured to detect phase difference between the fourth clock signal and the fifth clock signal,
    the phase interpolator performs phase interpolation with a weighting factor in accordance with the phase difference.

7. The duty ratio correction circuit according to claim 1, further comprising,
    a duty ratio detection circuit configured to detect a duty ratio of the sixth clock signal, wherein
    the phase interpolator performs phase interpolation with a weighting factor in accordance with the duty ratio.

8. A double-edged device, comprising:
    a duty ratio correction circuit; and
    a double-edged circuit, wherein
    the duty ratio correction circuit includes:
    a frequency divider configured to output a second clock signal having a first level that is inverted at a timing of a first edge of a first clock signal and a third clock signal having a second level that is inverted at a timing of a second edge of the first clock signal;
    phase interpolator configured to generate a fourth clock signal and a fifth clock signal by phase interpolation of the second clock signal, the third clock signal, a first inverted signal that is obtained by inverting the second clock signal, or an second inverted signal that is obtained by inverting the third clock signal; and
    a multiplier configured to output an exclusive OR signal of the fourth clock signal and the fifth clock signal as a sixth clock signal, and
    the double-edged circuit operates in synchronization with the timing of one of the first edge and the second edge of the sixth clock signal.

9. The double-edged device according to claim 8, wherein
    the first edge corresponds to a rising edge, and
    the second edge corresponds to a falling edge.

10. A method of correcting a duty ratio, comprising:
    outputting a second clock signal having a first level that is inverted at a timing of a first edge of a first clock signal;
    outputting a third clock signal having a second level that is inverted at a timing of a second edge of the first clock signal;
    generating a fourth clock signal and a fifth clock signal by phase interpolation of the second clock signal, the third clock signal, an first inverted signal that is obtained by inverting the second clock signal, or an second inverted signal that is obtained by inverting the third clock signal; and
    outputting an exclusive OR signal of the fourth clock signal and the fifth clock signal as a sixth clock signal.

* * * * *